(12) United States Patent
Lee

(10) Patent No.: US 10,153,044 B2
(45) Date of Patent: Dec. 11, 2018

(54) SEMICONDUCTOR MEMORY DEVICE AND OPERATING METHOD THEREOF

(71) Applicant: SK hynix Inc., Icheon-si, Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/658,516

(22) Filed: Jul. 25, 2017

(65) Prior Publication Data
US 2018/0190355 A1    Jul. 5, 2018

(30) Foreign Application Priority Data

Jan. 5, 2017  (KR) .................. 10-2017-0001879

(51) Int. Cl.
*G11C 16/06* (2006.01)
*G11C 16/10* (2006.01)
*G11C 16/30* (2006.01)
*G11C 16/26* (2006.01)

(52) U.S. Cl.
CPC .............. *G11C 16/10* (2013.01); *G11C 16/26* (2013.01); *G11C 16/30* (2013.01)

(58) Field of Classification Search
CPC ........ G11C 16/0483; G11C 2211/5641; G11C 16/3454; G11C 11/5621; G11C 11/5628; G11C 11/5642; G11C 16/10; G11C 16/3459; G11C 2211/5621; G11C 2211/5642; G11C 29/00; G11C 11/56; G11C 16/04; G11C 16/26
USPC .... 365/230.03, 185.24, 185.03, 205, 185.21, 365/185.11, 185.22, 185.28, 210.1, 365/210.14, 230.06, 233.1, 185.18, 365/185.19
See application file for complete search history.

(56) References Cited

U.S. PATENT DOCUMENTS

2011/0194347 A1*  8/2011  Chae ................... G11C 11/5628
                                              365/185.03

FOREIGN PATENT DOCUMENTS

KR        1020150054528 A        5/2015

* cited by examiner

*Primary Examiner* — Thong Q Le
(74) *Attorney, Agent, or Firm* — William Park & Associates LTD.

(57) ABSTRACT

A semiconductor memory device including a memory cell array including a plurality of memory blocks, a voltage generator applying operation voltages to a selected memory block, among the plurality of memory blocks, a control logic generating converted data by converting data bit sets respectively corresponding to at least one set of program states among a plurality of program states, during a program operation, and a read and write circuit temporarily storing the converted data and performing a program operation by controlling potential levels of bit lines of the memory cell array in accordance with stored converted data.

22 Claims, 12 Drawing Sheets

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2017-0001879 filed on Jan. 5, 2017 in the Korean Intellectual Property Office, the entire disclosure of which is incorporated by reference herein.

BACKGROUND

1. Technical Field

Various embodiments of the present disclosure generally relate to an electronic device, and more particularly, to a semiconductor memory device and an operating method thereof.

2. Related Art

Semiconductor devices, particularly, semiconductor memory devices are generally classified into volatile memory devices and nonvolatile memory devices.

A non-volatile memory device performs a read and write operation at a relatively low speed, but retains stored data even when power supply is cut off. Accordingly, the non-volatile memory device is used to store data to be retained regardless of power supply. Examples of the non-volatile memory device are a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like. Flash memories are classified into NOR type flash memories and NAND type flash memories.

The flash memories have an advantage over a RAM in which data is freely programmed and erased, and an advantage over the ROM in which stored data is retained even when a power supply is cut off. The flash memories are widely used as a storage medium of portable electronic devices such as a digital camera, a personal digital assistant (PDA), and an MP3 player.

SUMMARY

Various embodiments relate to a semiconductor memory device capable of stably programming and reading data corresponding to a program state having a high threshold voltage distribution of a semiconductor memory device and an operating method thereof.

According to an embodiment, a semiconductor memory device may include a memory cell array including a plurality of memory blocks; a voltage generator applying operation voltages to a selected memory block, among the plurality of memory blocks; a control logic generating converted data by converting data bit sets respectively corresponding to at least one set of program states among a plurality of program states, during a program operation; and a read and write circuit temporarily storing the converted data and performing a program operation by controlling potential levels of bit lines of the memory cell array in accordance with stored converted data.

According to an embodiment, a semiconductor memory device may include a memory cell array including a plurality of memory blocks; a voltage generator applying operation voltages to a selected memory block, among the plurality of memory blocks; a control logic generating converted data by converting a data bit set corresponding a set program states among a plurality of program states, during a program operation; and a read and write circuit temporarily storing the converted data and programming the converted data by controlling potential levels of bit lines of the memory cell array in accordance with stored converted data.

According to an embodiment, a method of operating a semiconductor memory device may include inputting data including a plurality of data bit sets to be programmed to memory cells during a program operation; generating converted data by converting data bit sets respectively corresponding to at least one set of program states among the plurality of data bit sets; and programming the converted data to the memory cells.

DETAILED DESCRIPTION

Figure 1:
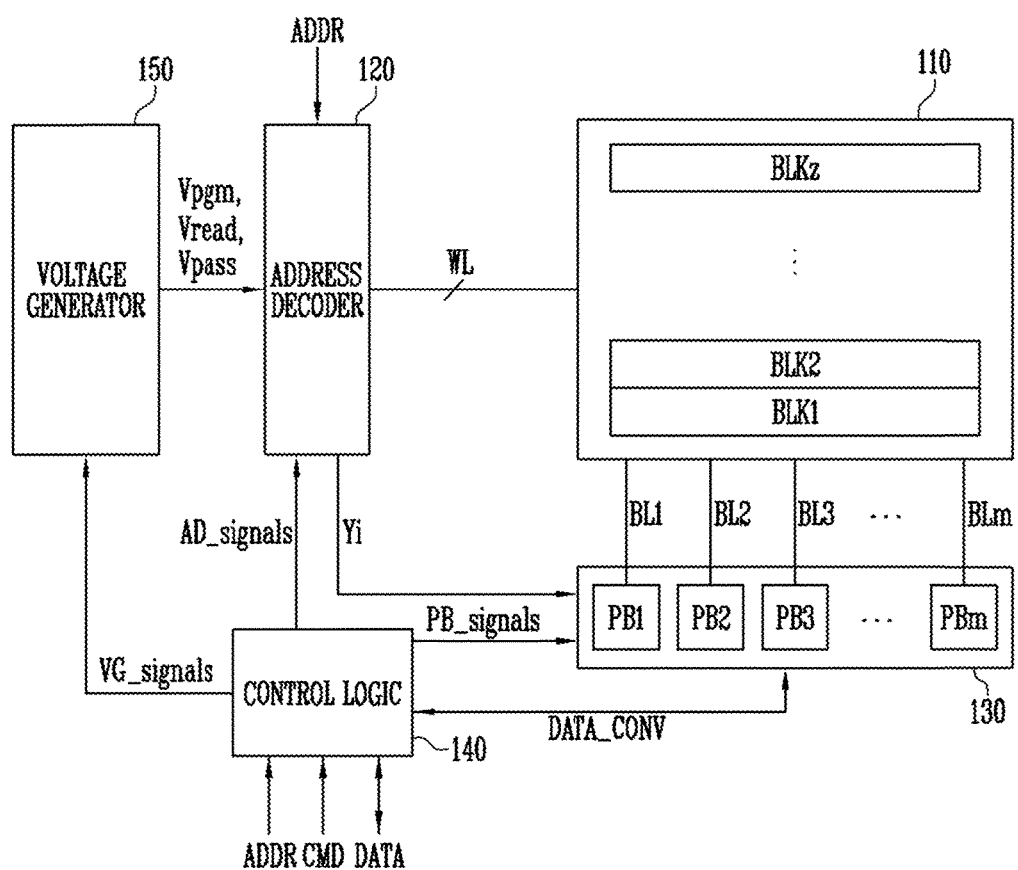
FIG. 1 is a block diagram showing a semiconductor memory device according to an embodiment of the present disclosure.

In the following detailed description, only certain examples of embodiments of the present disclosure have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive.

In the entire specification, when an element is referred to as being "connected" or "coupled" to another element, it can be directly connected or coupled to the other element or be indirectly connected or coupled to the other element with one or more intervening elements interposed therebetween. In addition, when an element is referred to as "including" a component, this indicates that the element may further include another component instead of excluding another component unless there is a different disclosure.

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 is a block diagram showing a memory device according to an embodiment of the present disclosure.

Referring to FIG. 1, a semiconductor memory device 100 may include a memory cell array 110, an address decoder 120, a read and write circuit 130, a control logic 140, and a voltage generator 150.

The address decoder 120, the read and write circuit 130, and the voltage generator 150 may be defined as peripheral circuits for performing a program operation and a read operation on the memory cell array 110.

The memory cell array 110 may include a plurality of memory blocks BLK1 to BLKz. The plurality of memory blocks BLK1 to BLKz may be coupled to the address decoder 120 via word lines WL. The plurality of memory blocks BLK1 to BLKz may be coupled to the read and write circuit 130 via bit lines BL1 to BLm. Each of the plurality of memory blocks BLK1 to BLKz may include a plurality of memory cells. According to an embodiment, the plurality of memory cells may be non-volatile memory cells, and more specifically, the plurality of memory cells may be non-volatile memory cells based on a charge trap device. A plurality of memory cells commonly coupled to one word line may be defined as one page. The memory cell array 110 may include a plurality of pages. In addition, each of the plurality of memory blocks BLK1 to BLKz of the memory cell array 110 may include a plurality of strings. Each of the plurality of strings may include a drain select transistor, a plurality of memory cells, and a source select transistor coupled in series between a bit line and a source line.

The address decoder 120 may be coupled to the memory cell array 110 via the word lines WL. The address decoder 120 may be configured to operate in response to control signals AD_signals output from the control logic 140. The address decoder 120 may receive an address ADDR through an input/output buffer (not shown) in the semiconductor memory device 100.

In addition, the address decoder 120 may apply an operation voltage such as a program voltage Vpgm and a pass voltage Vpass generated by the voltage generator 150 to a selected memory block among the plurality of memory blocks BLK1 to BLKz via a plurality of word lines WLs of the memory cell array 110 during a program operation.

The program operation of the semiconductor memory device 100 may be performed by selecting at least one of the plurality of memory blocks BLK1 to BLKz, and a program operation on a selected memory block may be performed in a page unit.

The address decoder 120 may apply an operation voltage such as a read voltage Vread and the pass voltage Vpass generated by the voltage generator 150 to a selected memory block among the plurality of memory blocks BLK1 to BLKz via the plurality of word lines WL of the memory cell array 110 during a read operation.

The read operation of the semiconductor memory device 100 may be performed by selecting at least one of the plurality of memory blocks BLK1 to BLKz, and a read operation on a selected memory block may be performed in a page unit.

The address ADDR received at the request of the program operation and the read operation may include a block address, a row address, and a column address. The address decoder 120 may select one memory block and one word line according to the block address and the row address. A column address Yi may be decoded by the address decoder 120 and provided to the read and write circuit 130.

The address decoder 120 may include a block decoder, a row decoder, a column decoder, and an address buffer.

The read and write circuit 130 may include a plurality of page buffers PB1 to PBm. The plurality of page buffers PB1 to PBm may be coupled to the memory cell array 110 through the bit lines BL1 to BLm. Each of the plurality of page buffers PB1 to PBm may receive and temporarily store converted data DATA_CONV from the control logic 140 during the program operation and control potential levels of bit lines BL1 to BLm corresponding thereto in accordance with the converted data DATA_CONV stored to perform the program operation on the selected memory block, among the plurality of memory blocks BLK1 to BLKz included in the memory cell array 110.

In addition, during the read operation, each of the plurality of page buffers PB1 to PBm may sense the potential levels or the current amounts of the bit lines BL1 to BLm and the read and write circuit 130 may perform the read operation on the selected memory block, among the plurality of memory blocks BLK1 to BLKz included in the memory cell array 110. The converted data DATA_CONV read out during the read operation may be output to the control logic 140.

The control logic 140 may be coupled to the address decoder 120, the read and write circuit 130, and the voltage generator 150. The control logic 140 may receive a command CMD, data DATA, and the address ADDR through the input/output buffer (not shown) of the semiconductor memory device 100. The control logic 140 may be configured to control all operations of the semiconductor memory device 100 in response to the command CMD.

When the command CMD corresponding to the program operation is input, the control logic 140 may invert and convert a portion of data bits of a data bit set corresponding to at least one set of a program state having a highest threshold voltage distribution among a plurality of program states, where the data bit set corresponds to a program state in accordance with the data DATA and the address ADDR received together with the command CMD. When a program method of a memory cell is a tri-level cell (TLC) method, 3-bit data may constitute one data bit set and include least significant bit (LSB) data, central significant bit (CSB) data, and most significant bit (MSB) data. In addition, when the program method of the memory cell is a quad level cell (QLC) method, 4-bit data may constitute one data bit set and include the least significant bit (LSB) data, least central significant bit (LCSB) data, and most central significant bit (MCSB) data, and the most significant bit (MSB) data. Some program states may be at least one program state having a highest threshold voltage distribution, among a plurality of program states. Further, the control logic 140 may compare the number of "1" data with the number of "0" data of specific bit data, among some data bit sets corresponding to the program state in the data DATA received and invert and convert the specific bit data when a total number of "1" data is greater than a total number of "0" data. A method of inverting the data bit described above will be introduced below. The control logic 140 may store addresses of converted data in the program operation.

The control logic 140 may control the voltage generator 150, the address decoder 120, and the read and write circuit 130 to perform the program operation after performing a data invert operation.

When the command CMD corresponding to the read operation is input, the control logic 140 may control the voltage generator 150, the address decoder 120, and the read and write circuit 130 to perform the read operation on the selected memory block, among the plurality of memory blocks BLK1 to BLKz, according to the address ADDR input together with the command CMD.

The control logic 140 may receive the converted data DATA_CONV read from the selected memory block from the read and write circuit 130 and restore the converted data DATA_CONV according to the addresses of the stored converted data to output the converted data DATA_CONV to an outside in the program operation.

The voltage generator 150 may operate in response to control signals VG_signals output from the control logic 140. For example, the voltage generator 150 may generate and output the program voltage Vpgm and the pass voltage Vpass in response to the control signals VG_signals during the program operation. The voltage generator 150 may generate and output the read voltage Vread and the pass voltage Vpass in response to the control signals VG_signals during the read operation.

Figure 2:
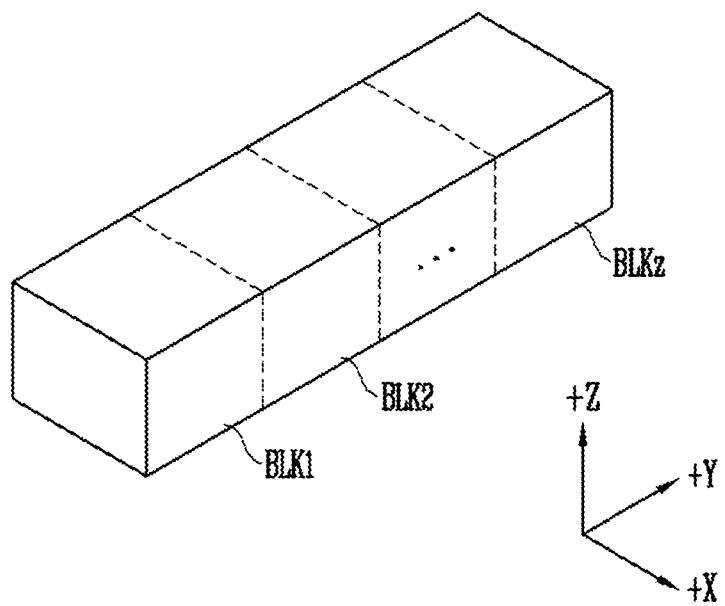
FIG. 2 is a block diagram showing an embodiment of a memory cell array of FIG. 1.

FIG. 2 is a block diagram showing an embodiment of a memory cell array of FIG. 1.

Referring to FIG. 2, the memory cell array 110 may include the plurality of memory blocks BLK1 to BLKz. Each memory block may have a three-dimensional structure. Each memory block may include a plurality of memory cells stacked on a substrate. The plurality of memory cells may be arranged along an +X direction, a +Y direction, and a +Z direction. The structure of each memory block will be described in more detail with reference to FIGS. 3 and 4.

Figure 3:
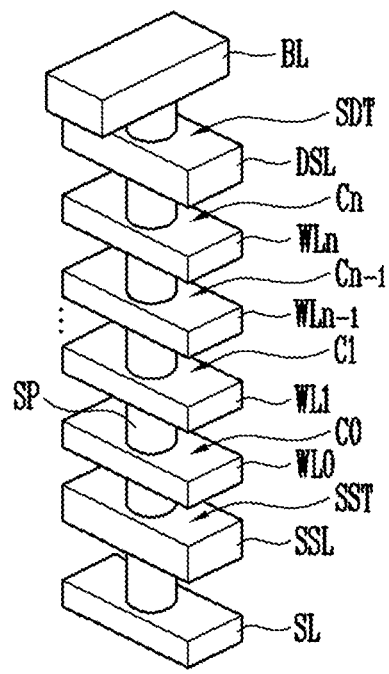
FIG. 3 is a three-dimensional diagram illustrating a memory string included in a memory block.
Figure 4:
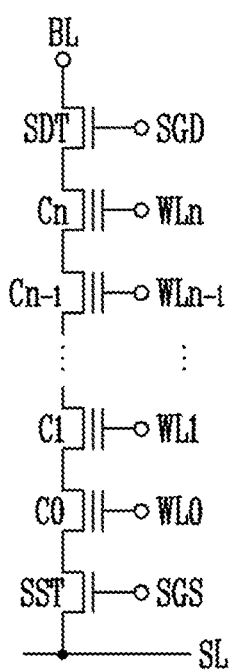
FIG. 4 is a circuit diagram showing the memory string shown in FIG. 3.

FIG. 3 is a three-dimensional diagram illustrating a memory string included in a memory block. FIG. 4 is a circuit diagram showing the memory string shown in FIG. 3.

Referring to FIGS. 3 and 4, a source line SL may be formed on a semiconductor substrate. A vertical channel layer SP may be formed on the source line SL. A top of the vertical channel layer SP may be coupled to a bit line BL. The vertical channel layer SP may be formed of polysilicon. A plurality of conductive films SGS, WL0 to WLn, and SGD may be formed to surround the vertical channel layer SP at different heights of the vertical channel layer SP. A multi-layer film (not shown) including a charge storage film may be formed on the surface of the vertical channel layer SP and the multilayer film may be located between the vertical channel layer SP and the conductive films SGSL, WL0 to WLn, and SGD. The multilayer film may be formed in an ONO structure in which an oxide film, a nitride film, and an oxide film are sequentially stacked.

A lowermost conductive film may become a source select line (or a first select line) SGS, and an uppermost conductive film may become a drain select line (or second select line) SGD. Conductive films between the select lines SGS and SGD may become word lines WL0 to WLn. In other words, the conductive films SGS, WL0 to WLn, and SGD may be formed in multiple layers on the semiconductor substrate and the vertical channel layer SP penetrating the conductive films SGS, WL0 to WLn, and SGD may be vertically coupled between the bit line BL and the source line SL formed on the semiconductor substrate.

A drain select transistor SDT may be formed in a portion of the vertical channel layer SP where the uppermost conductive film SGD surrounds the vertical channel layer SP, and a source select transistor SST may be formed in a portion of the vertical channel layer SP where the lowermost conductive film SGS surrounds the vertical channel layer SP. Memory cells C0 to Cn may be formed in portions of the vertical channel layer SP where intermediate conductive films WL0 to WLn surround the vertical channel layer SP.

According to the above structure, the memory string may include the source select transistor SST, the memory cells C0 to Cn, and the drain select transistor SDT vertically coupled to the substrate between the source line SL and the bit line BL. The source select transistor SST may electrically connect the memory cells C0 to Cn to the source line SL in accordance with a first select signal applied to the first select line SGS. The drain select transistor SDT may electrically connect the memory cells C0 to Cn to the bit line BL in accordance with a second select signal applied to the second select line SGD.

Figure 5:
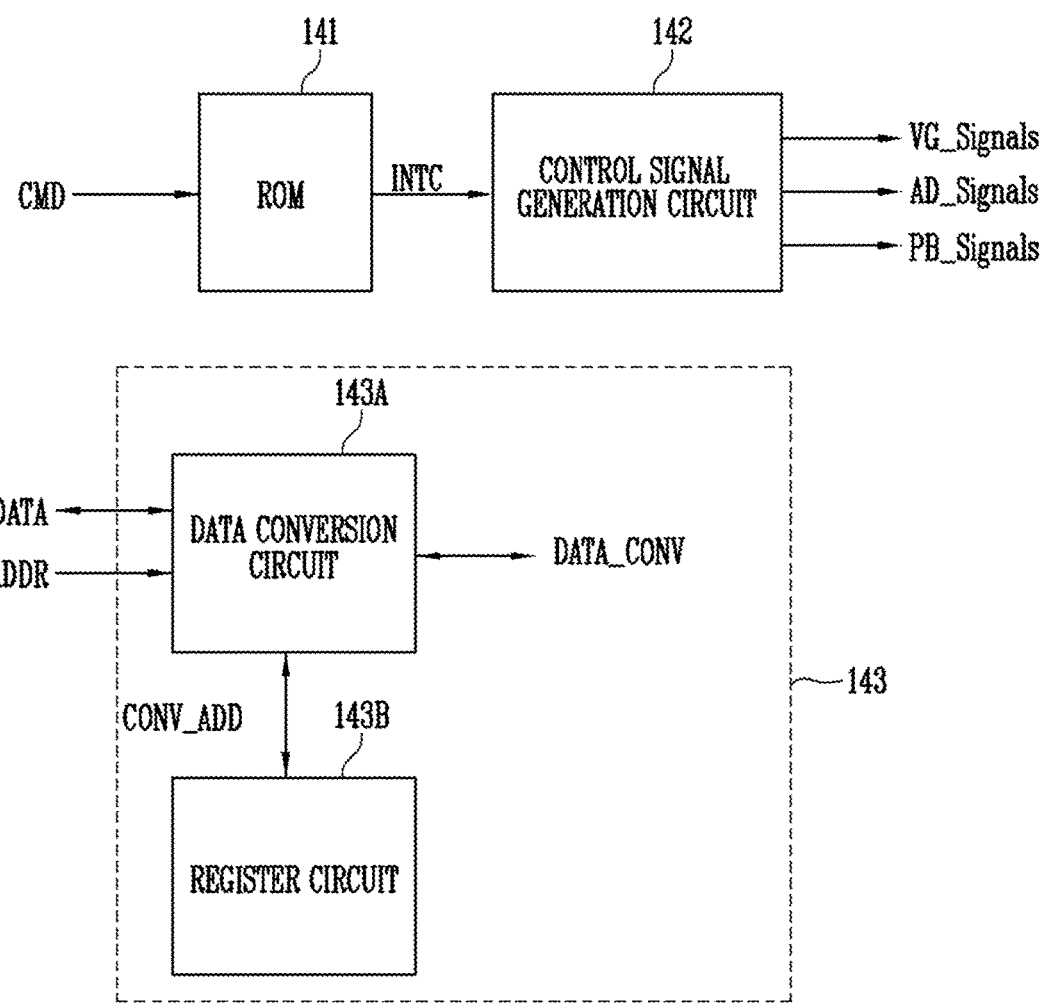
FIG. 5 is a block diagram showing an embodiment of a control logic of FIG. 1.

FIG. 5 is a block diagram showing an embodiment of the control logic of FIG. 1.

Referring to FIG. 5, the control logic 140 may include a read only memory (ROM) 141, a control signal generation circuit 142, and a data circuit 143.

The ROM 141 may store an algorithm for performing all operations of the semiconductor memory device, and generate and output an internal control signal INTC in accordance with the algorithm in response to the command CMD input from an outside, for example, a host Host coupled to the semiconductor memory device.

The control signal generation circuit 142 may generate and output the control signals VG_signals for controlling the voltage generator 150 of FIG. 1, the control signals AD_signals for controlling the address decoder 120 of FIG. 1, and control signals PB_signals for controlling the read and write circuits 130 of FIG. 1 in response to the internal control signal INTC output from the ROM 141.

The data circuit 143 may include a data conversion circuit 143A and a register circuit 143B.

The data conversion circuit 143A may generate the converted data DATA_CONV by inverting a portion of the data bits of the data bit set whose data is converted in a data conversion operation, corresponding to at least one set program state, among the data DATA input from the outside during the program operation, to output the converted data DATA_CONV to the read and write circuit 130 of FIG. 1. In addition, the data conversion circuit 143A may generate and output conversion address information CONV_ADD of the inversely converted data bit set according to the address ADDR input from the outside.

During the read operation, the data conversion circuit 143A may output the converted data DATA_CONV received from the read and write circuit 130 to the host Host coupled to the semiconductor memory device after inverting and restoring the converted data output from the read and write circuit 130 into at least a portion of the data bits of the inversely converted into the data bit set during the program operation by using the conversion address information CONV_ADD.

The register circuit 143B may store the conversion address information CONV_ADD output from the data conversion circuit 143A during the program operation and output the stored conversion address information CONV_ADD to the data conversion circuit 143A during the read operation.

Figure 6:
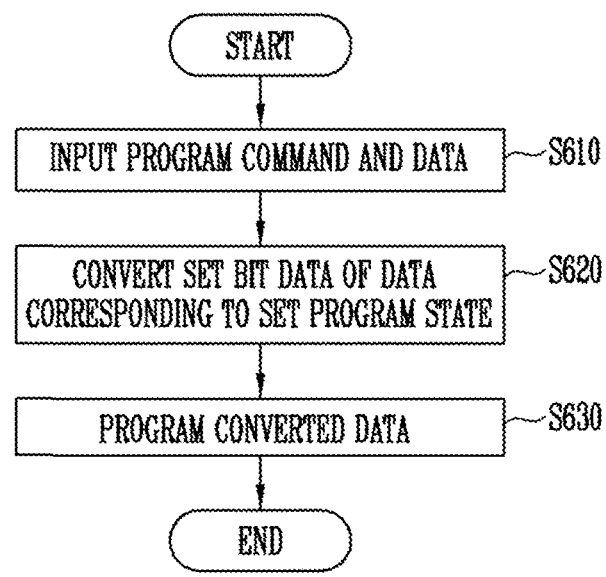
FIG. 6 is a flow chart showing a program operation of a semiconductor memory device according to an embodiment of the present disclosure.

FIG. 6 is a flow chart showing a program operation of a semiconductor memory device according to an embodiment of the present disclosure.

Figure 7:
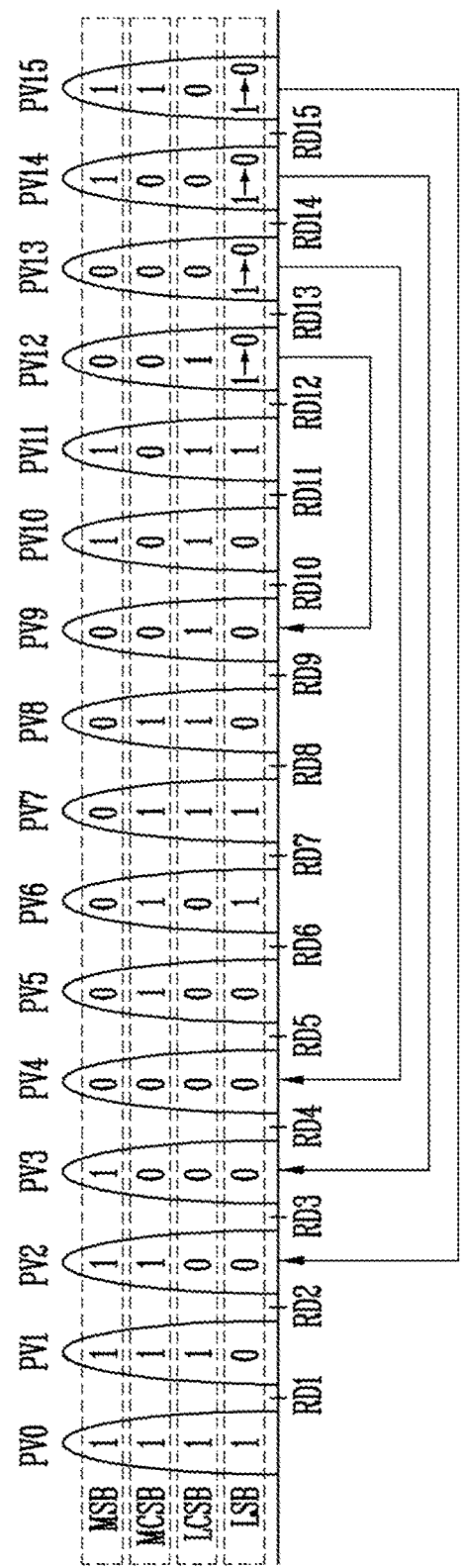
FIG. 7 is a threshold voltage distribution diagram showing an example of data conversion according to an embodiment of the present disclosure.

FIG. 7 is a threshold voltage distribution diagram showing an example of data conversion according to an embodiment of the present disclosure.

The program operation of the semiconductor memory device according to an embodiment of the present disclosure with reference to FIGS. 1 to 7 will be described below.

In an embodiment of the present disclosure, the program operation of the QLC method will be exemplified, and a method of converting data bit sets corresponding to four program states PV12, PV13, PV14, and PV15 each having a highest threshold voltage distribution with poor retention characteristics, among a plurality of program states PV0 to PV15, will be described. In this example, the four program states PV12, PV13, PV14, and PV15 may have the highest voltage distribution among all the program states PV0 to PV15. In another example, a method of only converting data bit sets corresponding to the two program states having the highest program voltage distribution among all the program states PV0 to PV15 may be considered. In short, the n program states, where n is less than the number of program states, having the highest voltage distribution among all the program states PV0 to PV15 is considered.

When the command CMD for a program command is input from the outside (S610), the ROM 141 of the control logic 140 may generate and output an internal control signal INTC corresponding to an algorithm of the program operation in accordance with the command CMD that is input. The control signal generation circuit 142 may generate the control signals VG_signals for controlling the voltage generator 150, the control signals AD_signals for controlling the address decoder 120, and the control signals PB_signals for controlling the read and write circuit 130 in response to the internal control signal INTC output from the ROM 141.

The data circuit 143 of the control logic 140 may invert a set bit data of data bit sets corresponding to data bit sets associated with the program states PV12 to PV15, i.e., the sets of program states PV12 to PV15, among the data DATA input from the outside, and generate the converted data DATA_CONV (S620). Data bit sets corresponding to the remaining program states PV0 to PV11 may be output as the converted data DATA_CONV without inverting and converting.

The data circuit 143 may generate the conversion address information CONV_ADD of the converted data to store the conversion address information CONV_ADD in the register circuit 143B during a data conversion operation.

Referring to FIG. 7, data bit sets corresponding to new program states PV9, PV4, PV3, and PV2 may be generated by inverting the set bit data (the LSB data), among the data bit sets corresponding to the sets of program states PV12 to PV15.

The LSB data "1" of a data bit set 0011 corresponding to the program state PV12 may be inverted to the LSB data "0" and the data bit set 0011 may be converted into a data bit set 0010. The data bit set 0010 may correspond to the program state PV9. That is, the data bit set 0011 corresponding to the program state PV12 may be converted into the data bit set 0010 corresponding to the program state PV9.

The LSB data "1" of a data bit set 0001 corresponding to the program state PV13 may be inverted to the LSB data "0" and the data bit set 0001 may be converted into a data bit set 0000. The data bit set 0000 may correspond to the program state PV4. That is, the data bit set 0001 corresponding to the program state PV13 may be converted into the data bit set 0000 corresponding to the program state PV4.

The LSB data "1" of a data bit set 1001 corresponding to the program state PV14 may be inverted into the LSB data "0" and the data bit set 1001 may be converted into a data bit set 1000. The data bit set 1000 may correspond to the program state PV3. That is, the data bit set 1001 corresponding to the program state PV14 may be converted into the data bit set 1000 corresponding to the program state PV3.

The LSB data "1" of a data bit set 1101 corresponding to the program state PV 15 may be inverted to the LSB data "0" and the data bit set 1101 may be converted into a data bit set 1100. The data bit set 1100 may correspond to the program state PV2. That is, the data bit set 1101 corresponding to the program state PV15 may be converted into the data bit set 1100 corresponding to the program state PV2.

As described above, the sets of program states PV12, PV13, PV14, and PV15 each having a highest threshold voltage distribution may be respectively converted into the sets of program states PV9, PV4, PV3, and PV2 each having a relatively lower threshold voltage distribution than the threshold voltage distributions of the sets of program states PV12, PV13, PV14, and PV15.

The plurality of page buffers PB1 to PBm of the read and write circuit 130 may receive and temporarily store the converted data DATA_CONV from the control logic 140 and control the potential levels of the corresponding bit lines BL1 to BLm in accordance with the converted data DATA_CONV that is stored. The voltage generator 150 may generate and output the program voltage Vpgm and the pass voltage Vpass in response to the control signals VG_signals. The address decoder 120 may apply the program voltage Vpgm and the pass voltage Vpass generated by the voltage generator 150 to word lines WL of the selected memory block, among the plurality of memory blocks BLK1 to BLKz included in the memory cell array 110, and program the converted data DATA_CONV to the memory cells C0 to Cn (S630).

As described above, according to an embodiment of the present disclosure, a data bit set corresponding to at least one program state having a highest threshold voltage distribution and a vulnerable retention characteristic, among a plurality of program states, may be converted into a data bit set corresponding to a relatively low program state to be programmed. Thus, the retention characteristic of data stored in the memory cell may be improved after the program operation.

Figure 8:
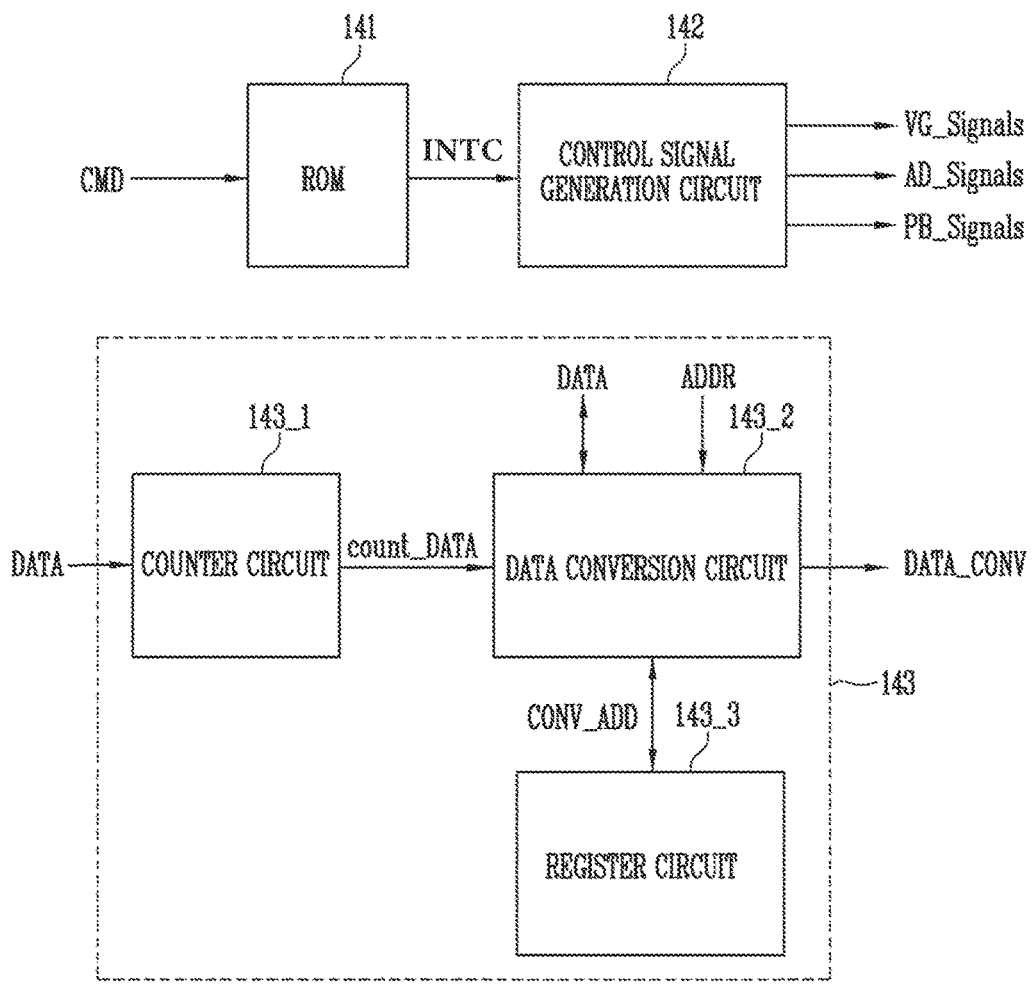
FIG. 8 is a block diagram showing another embodiment of the control logic of FIG. 1.

FIG. 8 is a block diagram showing another embodiment of the control logic of FIG. 1.

Referring to FIG. 8, the control logic 140 may include the ROM 141, the control signal generation circuit 142, and the data circuit 143.

The ROM 141 may store the algorithm for performing all operations of the semiconductor memory device, and generate and output the internal control signal INTC in response to the command CMD input from the outside, for example, the host Host coupled to the semiconductor memory device.

The control signal generation circuit 142 may generate and output the control signals VG_signals for controlling the voltage generator 150 of FIG. 1, the control signals AD_signals for controlling the address decoder 120 of FIG. 1, and the control signals PB_signals for controlling the read and write circuits 130 of FIG. 1 in response to the internal control signal INTC output from the ROM 141.

The data circuit 143 may include a counter circuit 143_1, a data conversion circuit 143_2, and a register circuit 143_3.

The counter circuit 143_1 may count first data "1" and second data "0" of the set data bits of the data bit set corresponding to at least one program state, among the data DATA input from the outside, and output a comparison result of the total number of first data "1" with the total number of second data "0" to a data counting signal count_DATA.

For example, the counter circuit 143_1 may output the data counting signal count_DATA controlling the data conversion circuit 143_2 to perform the data conversion operation when the total number of first data "1" is greater than the total number of second data "0", among the MSB data included in the data bit sets corresponding to at least one set of program states of the data DATA input from the outside.

The data conversion circuit 143_2 may determine whether to perform a data conversion operation in response to the data counting signal count_DATA output from the counter circuit 143_1 and generate the converted data DATA_CONV by inverting the set data bit of the data bit set corresponding to at least one set program state, among the data DATA input from the outside when performing the data conversion operation to output the converted data DATA_CONV to the read and write circuit 130 of FIG. 1. In addition, the data conversion circuit 143_2 may generate and output the conversion address information CONV_ADD of the inversely converted data bit set according to the address ADDR input from the outside.

During the read operation, the data conversion circuit 143_2 may output the converted data DATA_CONV received from the read and write circuit 130 of FIG. 1 to the host Host coupled to the semiconductor memory device by inverting and restoring the set data bit of the data bit set inverted during the program operation by using the conversion address information CONV_ADD.

The register circuit 143_3 may store the conversion address information CONV_ADD output from the data conversion circuit 143_2 in the program operation and output the conversion address information CONV_ADD that is stored to the data conversion circuit 143_2 in the read operation.

Figure 9:
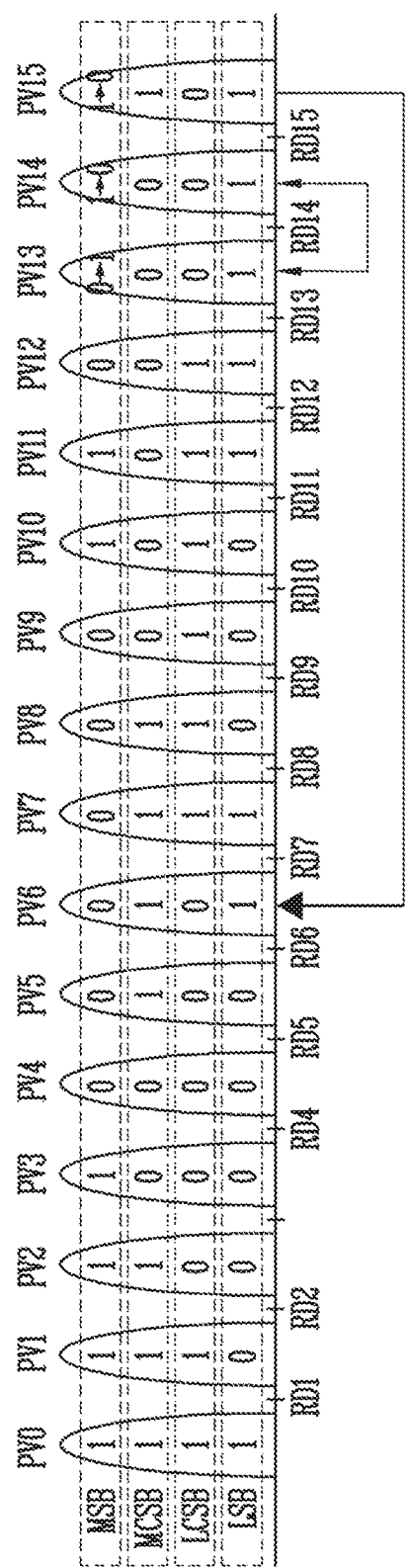
FIG. 9 is a threshold voltage distribution diagram showing an example of data conversion according to another embodiment of the present disclosure.

FIG. 9 is a threshold voltage distribution diagram showing an example of data conversion according to another embodiment of the present disclosure.

Referring to FIGS. 1 to 4, 6, 8, and 9, the program operation of the semiconductor memory device according to another embodiment of the present disclosure will be described below.

In an embodiment of the present disclosure, a program operation of a QLC method will be exemplified, and a method of converting data in accordance with MSB data bits included in data bit sets corresponding to three program states PV13, PV14, and PV15 each having a highest threshold voltage distribution and a vulnerable retention characteristic, among the plurality of program states PV0 to PV15, will be exemplified.

When the command CMD for the program command is input from the outside (S610), the ROM 141 of the control logic 140 may generate and output the internal control signal INTC corresponding to the algorithm of the program operation in accordance with the command CMD that is input. The control signal generation circuit 142 may generate and output the control signals VG_signals for controlling the voltage generator 150, the control signals AD_signals for controlling the address decoder 120, and the control signals PB_signals for controlling the read and write circuit 130 in response to the internal control signal INTC output from the ROM 141.

The data circuit 143 of the control logic 140 may compare the total number of first data "1" and the total number of second data "0" of the set bit data (the MSB data) of the data bit sets corresponding to the sets of program states PV13 to PV15, among the data DATA input from the outside, and perform the data conversion operation when the total number of first data "1" is greater than the total number of second data "0" (S620). In the data conversion operation, the converted data DATA_CONV may be generated by inverting the set bit data, among the data bit sets corresponding to the sets of program states PV13 to PV15. The data bit sets corresponding to the remaining program states PV0 to PV12 may be output to the converted data DATA_CONV without converting.

The data circuit 143 may generate the conversion address information CONV_ADD of the converted data to store the conversion address information CONV_ADD in the register circuit 143_3 in the data conversion operation.

Referring to FIG. 9, MSB data "0" of the data bit set 0001 corresponding to the program state PV13 may be inverted to MSB data "1" and the data bit set 0001 may be converted into a data bit set 1001. The data bit set 1001 may correspond to the program state PV14. That is, the data bit set 0001 corresponding to the program state PV13 may be converted into the data bit set 1001 corresponding to the program state PV14.

MSB data "1" of the data bit set 1001 corresponding to the program state PV14 may be inverted to "0" data and the data bit set 1001 may be converted into the data bit set 0001. The data bit set 0001 may correspond to the program state PV13. That is, the data bit set 1001 corresponding to the program state PV14 may be converted into the data bit set 0001 corresponding to the program state PV13.

MSB data "1" of the data bit set 1101 corresponding to the program state PV15 may be inverted to "0" data and the data bit set 1101 may be converted into a data bit set 0101. The data bit set 0101 may correspond to the program state PV6. That is, the data bit set 1101 corresponding to the program state PV15 may be converted into the data bit set 0101 corresponding to the program state PV6.

As described above, the data bit sets corresponding to the program state PV13 and the program state PV14 may be exchanged, and the set program state PV15 having the highest threshold voltage distribution may be converted into the program state PV6 having a lower threshold voltage distribution than program state PV15.

The plurality of page buffers PB1 to PBm of the read and write circuit 130 may receive and temporarily store the converted data DATA_CONV from the control logic 140 and control the potential levels of the corresponding bit lines BL1 to BLm in accordance with the converted data DATA_CONV that is stored. The voltage generator 150 may generate and output the program voltage Vpgm and the pass voltage Vpass in response to the control signals VG_signals. The address decoder 120 may apply the program voltage Vpgm and the pass voltage Vpass generated by the voltage generator 150 to the word lines WL of the selected memory block, among the plurality of memory blocks BLK1 to BLKz included in the memory cell array 110, and program the converted data DATA_CONV to the memory cells C0 to Cn (S630).

As described above, according to another embodiment of the present disclosure, the data bit set corresponding to the program state PV15 having the highest threshold voltage distribution and a vulnerable retention characteristic, among the plurality of program states, may be converted into the data bit set corresponding to a relatively low program state to be programmed. Therefore, the retention characteristic of the data stored in the memory cell may be improved after the program operation.

Figure 10:
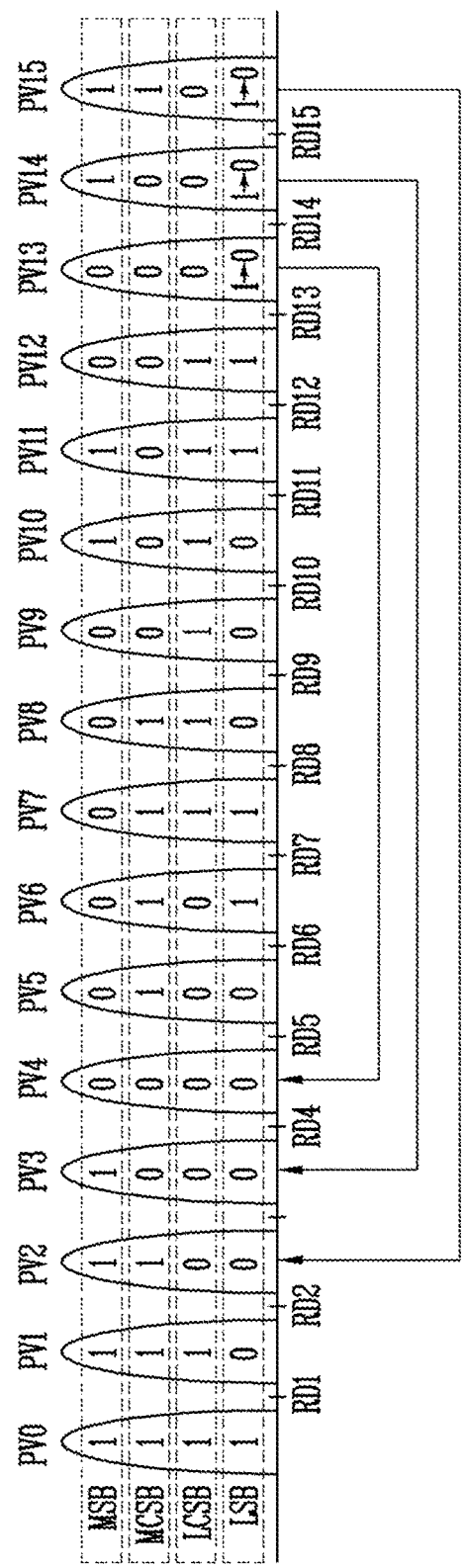
FIG. 10 is a threshold voltage distribution diagram showing an example of data conversion according to another embodiment of the present disclosure.

FIG. 10 is a threshold voltage distribution diagram showing an example of data conversion according to another embodiment of the present disclosure.

In the description with reference to FIG. 9, a method of converting data in accordance with the MSB data bit included in data bit sets corresponding to three program states PV13, PV14, and PV15 each having a highest threshold voltage distribution and a vulnerable retention characteristic, among the plurality of program states PV0 to PV15, has been described.

In FIG. 10, a method of converting data in accordance with an LSB data bit included in the data bit set corresponding to three program states PV13, PV14, and PV15 each having a highest threshold voltage distribution and a vulnerable retention characteristic, among the plurality of program states PV0 to PV15, will be described.

Referring to FIGS. 5, 6, and 10, an example of data conversion according to another embodiment of the present disclosure will be described below.

The data circuit 143 of the control logic 140 may compare a total number of first data "1" and a total number of second data "0" of the set bit data (the LSB data), among the data bit sets corresponding to the sets of program states PV13 to PV15, of the data DATA input from the outside and perform the data conversion operation when the total number of first data "1" is greater than the total number of second data "0" (S620). In the data conversion operation, the converted data DATA_CONV may be generated by inverting the set bit data, among the data bit sets corresponding to the sets of program states PV13 to PV15. The data bit sets corresponding to the remaining program states PV0 to PV12 may be output to the converted data DATA_CONV without conversion.

The data circuit 143 may generate the conversion address information CONV_ADD of the converted data to store the conversion address information CONV_ADD in the register circuit 143B during the data conversion operation.

Referring to FIG. 10, LSB data "1" of the data bit set 0001 corresponding to the program state PV13 may be inverted to "0" data and the data bit set 0001 may be converted into the data bit set 0000. The data bit set 0000 may correspond to the program state PV4. That is, the data bit set 0001 corresponding to the program state PV4 may be converted into the data bit set 0000.

LSB data "1" of the data bit set 1001 corresponding to the program state PV14 may be inverted to "0" data and the data bit set 1001 may be converted into the data bit set 1000. The data bit set 1000 may correspond to the program state PV3. That is, the data bit set 1001 corresponding to the program state PV14 may correspond to the data bit set 1000 corresponding to the program state PV3.

LSB data "1" of the data bit set 1101 corresponding to the program state PV15 may be inverted to "0" data and the data bit set 1101 may be converted into the data bit set 1100. The data bit set 1100 may correspond to the program state PV2. That is, the data bit set 1101 corresponding to the program state PV15 may be converted into the data bit set 1100 corresponding to the program state PV2.

As described above, the data bit sets of the program states PV13, PV14, and PV15 each having vulnerable retention characteristics may be converted into the data bit sets of the program states PV4, PV3, and PV2 each having a relatively lower threshold voltage distribution.

Figure 11:
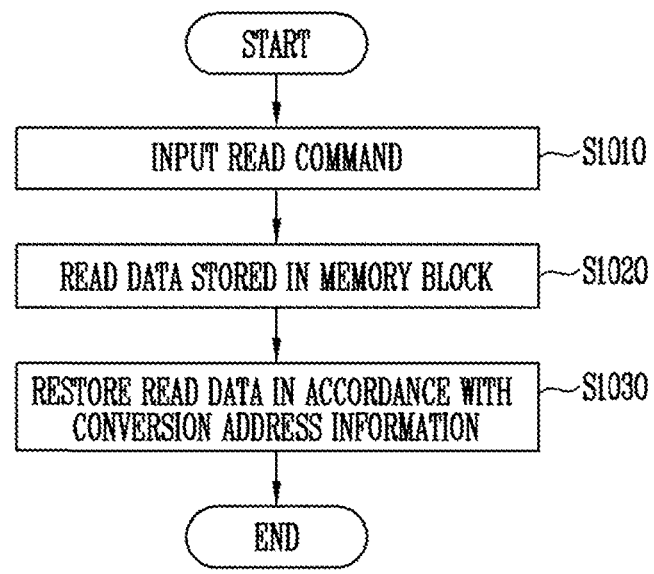
FIG. 11 is a flow chart showing a read operation of the semiconductor memory device according to an embodiment of the present disclosure.

FIG. 11 is a flow chart showing a read operation of the semiconductor memory device according to an embodiment of the present disclosure.

The read operation of the semiconductor memory device according to an embodiment of the present disclosure will be described below with reference to FIGS. 1 to 5, and 11.

When the command CMD for a read command is input from the outside (S1010), the ROM 141 of the control logic 140 may generate and output the internal control signal INTC corresponding to an algorithm of the read operation in accordance with the command CMD. The control signal generation circuit 142 may generate and output the control signals VG_signals for controlling the voltage generator 150, the control signals AD_signals for controlling the address decoder 130, and the control signals PB_signals for controlling the read and write circuit 130 in response to the internal control signal output INTC from the ROM 141.

The address decoder 120, the read and write circuit 130, and the voltage generator 150 may output the converted data DATA_CONV by reading the data stored in the selected memory block, among the plurality of memory blocks BLK1 to BLKz included in the memory cell array 110 (S1020).

During the read operation, the voltage generator 150 may generate and output the read voltage Vread and the pass voltage Vpass in response to the control signals VG_signals. The read voltage Vread may include a plurality of read voltages RD1 to RD15, and the plurality of read voltages RD1 to RD15 may be sequentially output.

The address decoder 120 may sequentially apply the plurality of read voltages RD1 to RD15 generated by the voltage generator 150 to a selected word line of the selected memory block and apply the pass voltages Vpass to unselected word lines.

The read and write circuit 130 may generate and output the converted data DATA_CONV to the control logic 140 by sensing the potential levels or the current amounts of the bit lines BL1 to BLm whenever the plurality of read voltages RD1 to RD15 are applied.

The control logic 140 may invert the set bit data (for example, the LSB data) of the data bit set that is converted, among the converted data DATA_CONV corresponding to the program states (for example, PV9, PV4, PV3, and PV2) converted in the program operation according to the conversion address information CONV_ADD stored in the register circuit 143_B and restore the set bit data to the data bit set corresponding to the program states (PV12 to PV15) input in the program operation to output the data bit set to the outside.

As described above, the program operation and the read operation of the QLC method are described as an example in an embodiment and another embodiment of the present disclosure. However, the invention is also applicable to a TLC method and a multilevel cell (MLC) method by which memory cells are programmed into program states corresponding to a plurality of threshold voltage distributions.

Figure 12:
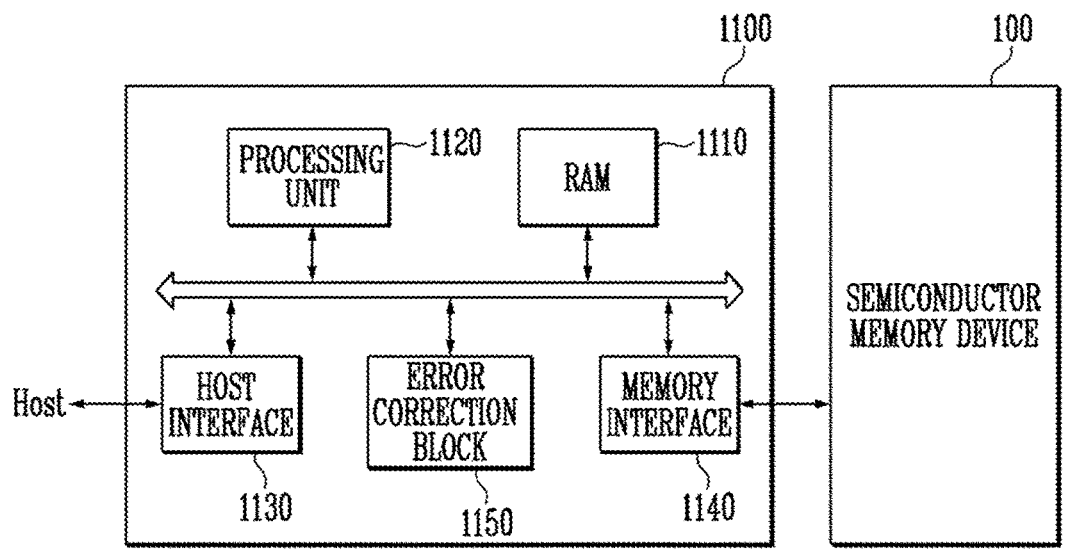
FIG. 12 is a block diagram showing a memory system including the semiconductor memory device of FIG. 1.

FIG. 12 is a block diagram showing a memory system including the semiconductor memory device of FIG. 1.

Referring to FIG. 12, a memory system 1000 may include the semiconductor memory device 100 and a controller 1100.

The semiconductor memory device 100 may be the same as the semiconductor memory device described with reference to FIG. 1, and a redundant description will be omitted.

The controller 1100 may be coupled to the host Host and the semiconductor memory device 100. In response to a request from the host Host, the controller 1100 may be configured to access the semiconductor memory device 100. For example, the controller 1100 may be configured to control read, write, erase, and background operations of the semiconductor memory device 100. The controller 1100 may be configured to provide an interface between the semiconductor memory device 100 and the host Host. The controller 1100 may be configured to drive firmware for controlling the semiconductor memory device 100.

The controller 1100 may include a random access memory 1110, a processing unit 1120, a host interface 1130, a memory interface 1140, and an error correction block 1150. The RAM 1110 may be used as at least one of an operation memory of the processing unit 1120, a cache memory between the semiconductor memory device 100 and the host Host, and a buffer memory between the semiconductor memory device 100 and the host Host. The processing unit 1120 may control all operations of the controller 1100. In addition, the controller 1100 may temporarily store program data provided from the host Host during the write operation.

The host interface 1130 may include a protocol for performing data exchange between the host Host and the controller 1100. As an exemplary embodiment, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The memory interface 1140 may interface with the semiconductor memory device 100. For example, the memory interface 1140 may include a NAND interface or a NOR interface.

The error correction block 1150 may be configured to detect and correct errors of data received from the semiconductor memory device 100 by using an error correcting code (ECC). The processing unit 1120 may control the semiconductor memory device 100 to adjust the read voltage according to an error detection result of the error correction block 1150 and perform a re-read operation. In an exemplary embodiment, the error correction block may be provided as a constituent of the controller 1100.

The controller 1100 and the semiconductor memory device 100 may be integrated into one semiconductor device. As an exemplary embodiment, the controller 1100 and the semiconductor memory device 100 may be integrated into one semiconductor device to form a memory card. For example, the controller 1100 and the semiconductor memory device 100 may be integrated into one semiconductor device and form a memory card such as a PC card, which is a personal computer memory card international association (PCMCIA), a compact flash card (CF), a smart media card (SM and SMC), a memory stick, a multimedia card (MMC, RS-MMC, and MMCmicro), an SD card (SD, miniSD, microSD, and SDHC), and a universal flash storage (UFS), and the like.

The controller 1100 and the semiconductor memory device 100 may be integrated into one semiconductor device to form a solid state drive SSD. The solid state drive SSD may include a storage device configured to store data in a semiconductor memory. When the memory system 1000 is used as the solid state drive SSD, an operation speed of the host Host coupled to a memory system 1000 may be remarkably improved.

In another embodiment, the memory system 1000 may be provided as one of various elements of an electronic device such as a computer, a ultra-mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or one of various elements for forming a computing system, or the like.

In an exemplary embodiment, the semiconductor memory device 100 or the memory system 1000 may be embedded in packages of various forms. For example, the semiconductor memory device 100 or the memory system 1000 may be embedded in packages such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multichip package (MCP), a wafer-level fabricated package (WFP), a wafer-level processed stack package (WSP), or the like.

Figure 13:
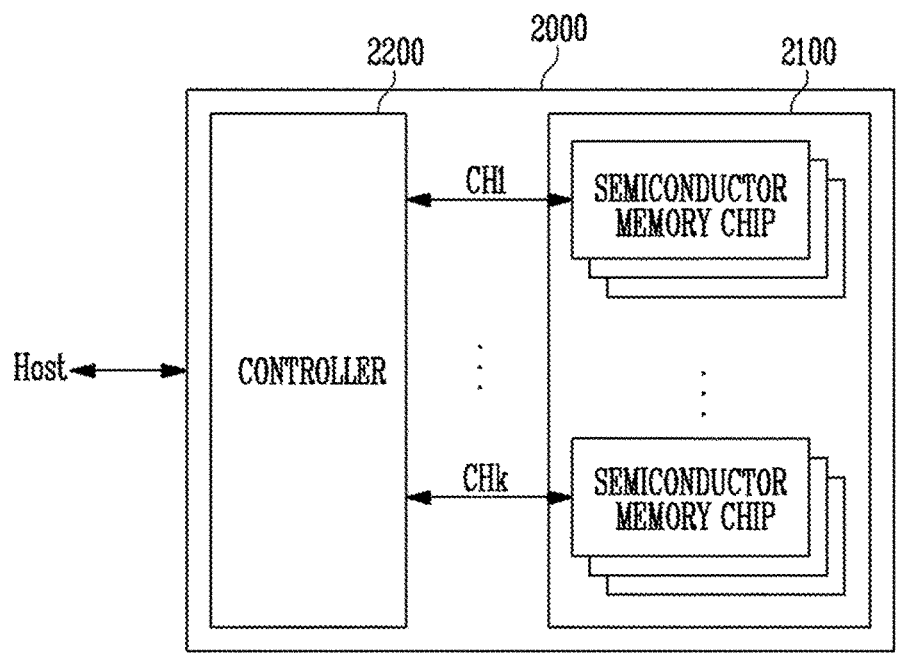
FIG. 13 is a block diagram showing an application example of the memory system of FIG. 12.

FIG. 13 is a block diagram showing an application example of the memory system of FIG. 12.

Referring to FIG. 13, a memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 13, the plurality of groups may be shown as communicating with the controller 2200 through first to kth channels CH 1 to CHk, respectively. Each semiconductor memory chip may be configured and operate similar to one of the semiconductor memory devices 100 described with reference to FIG. 1.

Each group may be configured to communicate with the controller 2200 through one common channel. The controller 2200 may be configured similar to the controller 1100 described with reference to FIG. 11 and configured to control the plurality of memory chips of the semiconductor memory device 2100 through a plurality of channels CH1 to CHk.

Figure 14:
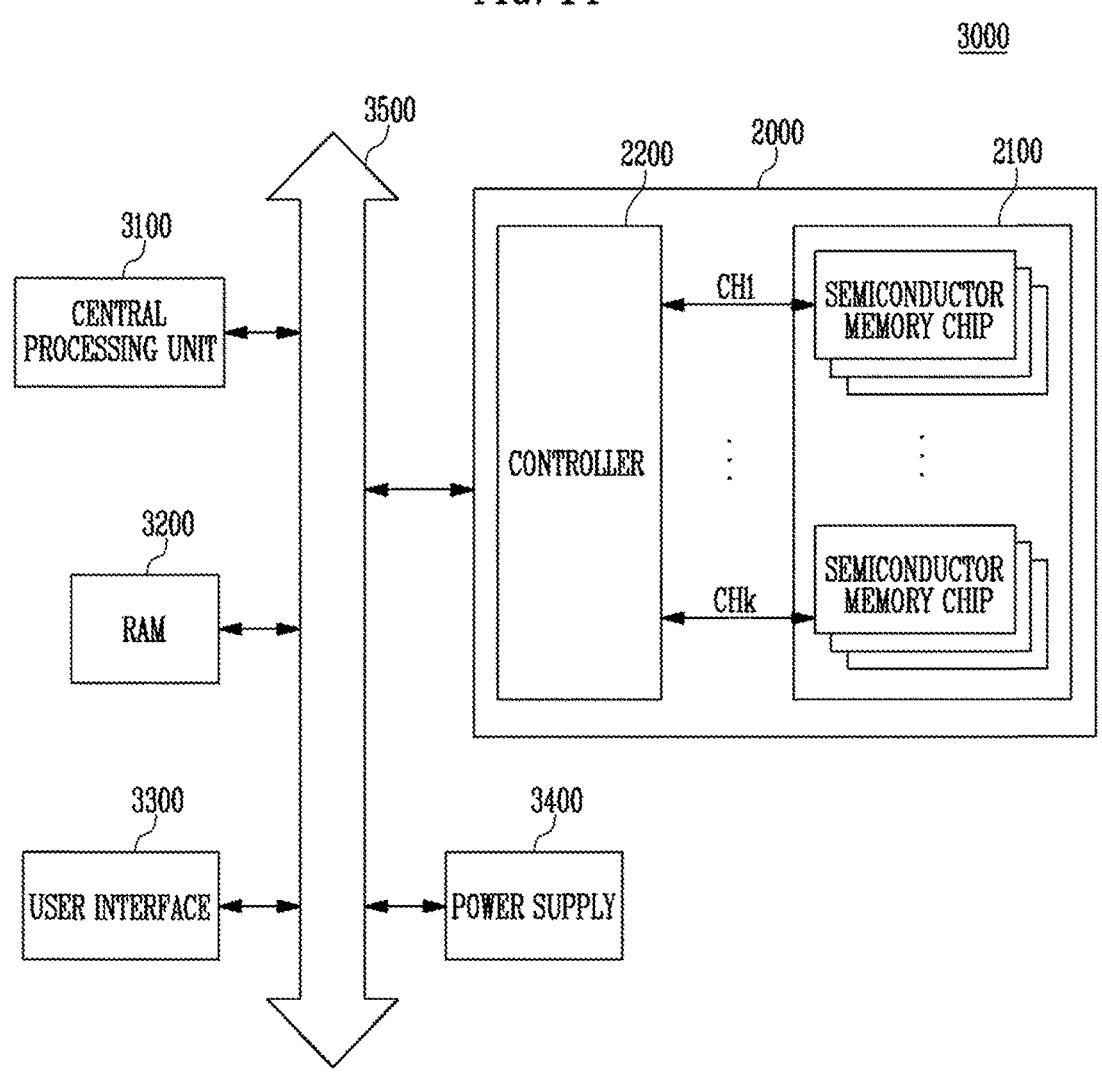
FIG. 14 is a block diagram showing a computing system including the memory system shown with reference to FIG. 13.

FIG. 14 is a block diagram showing a computing system including the memory system shown with reference to FIG. 13.

Referring to FIG. 14, a computing system 3000 may include a central processing unit 3100, a random access memory (RAM) 3200, a user interface 3300, a power supply 3400, a system bus 3500, and the memory system 2000.

The memory system 2000 may be coupled to the central processing unit 3100, the RAM 3200, the user interface 3300, and the power supply 3400 via the system bus 3500. Data provided via the user interface 3300 or processed by the central processing unit 3100 may be stored in the memory system 2000.

In FIG. 14, the semiconductor memory device 2100 may be coupled to the system bus 3500 through the controller 2200. However, the semiconductor memory device 2100 may be configured to be directly coupled to the system bus 3500. The function of the controller 2200 may be performed by the central processing unit 3100 and the RAM 3200.

In FIG. 14, the memory system 2000 described with reference to FIG. 13 may be provided. However, the memory system 2000 may be replaced with the memory system 1000 described with reference to FIG. 12. As an exemplary embodiment, the computing system 3000 may be configured to include all of the memory systems 1000 and 2000 described with reference to FIGS. 12 and 13.

According to the present disclosure, during a program operation of a semiconductor memory device, some data values of program data corresponding to a program state having a highest threshold voltage distribution may be converted so that the program state having a highest threshold voltage distribution may be converted into a program state having a relatively lower threshold voltage distribution, and the read data in a read operation may be restored after checking whether the read data is converted, thereby performing a stable program operation and read operation.

Examples of embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present disclosure as set forth in the following claims.

What is claimed is:

1. A semiconductor memory device, comprising:
a memory cell array configured to include a plurality of memory cells;
a voltage generator configured to apply operation voltages to selected memory cells, among the plurality of memory cells; and
a control logic configured to generate converted data by reducing a number of data bit sets respectively corresponding to at least one program state among a plurality of program states, and to control the selected memory cells to store the converted data.

2. The semiconductor memory device of claim 1, wherein the at least one program state includes a program state having a highest threshold voltage distribution among the plurality of program states.

3. The semiconductor memory device of claim 1, wherein the converted data has a data bit set corresponding to a program state having a lower threshold voltage distribution than the at least one program state.

4. The semiconductor memory device of claim 1, wherein the control logic generates the converted data by inverting data values of set data of the data bit sets.

5. The semiconductor memory device of claim 4, wherein the set data is least significant bit (LSB) data.

6. The semiconductor memory device of claim 4, wherein the control logic includes a data circuit configured to perform a data conversion operation for generating the converted data by inverting the data values of the set data of the data bit sets during the program operation.

7. The semiconductor memory device of claim 6, further comprising:
a read and write circuit configured to temporarily store the converted data,
wherein the control logic further comprises:
a read only memory (ROM) configured to store an algorithm and to output an internal control signal in accordance with the algorithm in response to an input command; and
a control signal generation circuit configured to generate control signals for controlling the voltage generator and the read and write circuit in response to the internal control signal.

8. The semiconductor memory device of claim 7, wherein the data circuit comprises:
a data conversion circuit configured to generate conversion address information indicating an address of a converted data bit set among the data bit sets, according to an address of the selected memory cells; and
a register circuit configured to store the conversion address information output from the data conversion circuit during the program operation.

9. The semiconductor memory device of claim 8, wherein during a read operation, the read and write circuit reads the converted data stored in the selected memory cells, and outputs the converted data to the control logic.

10. The semiconductor memory device of claim 9, wherein the register circuit outputs the conversion address information to the data conversion circuit in the read operation, and
the data conversion circuit restores the converted data output from the read and write circuit into the data bit sets by using the conversion address information in the read operation.

11. A semiconductor memory device, comprising:
a memory cell array configured to include a plurality of memory cells;
a voltage generator configured to apply operation voltages to selected memory cells, among the plurality of memory cells; and
a control logic configured to generate converted data according to a total number of data values of data bit sets respectively corresponding to at least one program state among a plurality of program states, and to control the selected memory cells to store the converted data.

12. The semiconductor memory device of claim 11, wherein the at least one program state includes a program state having a highest threshold voltage distribution, among the plurality of program states.

13. The semiconductor memory device of claim 12, wherein the control logic performs a conversion operation of the data bit sets when a total number of first data values "1" is greater than a total number of second data values "0", among most significant bit (MSB) data of the data bit sets.

14. The semiconductor memory device of claim 12, wherein the control logic includes a data circuit configured to perform the data conversion operation to generate the converted data by inverting data values of the data bit sets.

15. The semiconductor memory device of claim 14, wherein the data circuit comprises:
- a counter circuit configured to count and to compare a total number of first data values "1" and a total number of second data values "0", among set data of the data bit sets, and to output a counting signal in accordance with a comparison result during the program operation;
- a data conversion circuit configured to perform the data conversion operation in response to the data counting signal and to generate conversion address information indicating an address of a converted data bit set among the data bit sets, according to an address of the selected memory cells; and
- a register circuit configured to store the conversion address information output from the data conversion circuit during the program operation.

16. A method of operating a semiconductor memory device, the method comprising:
- inputting data including a plurality of data bit sets to be programmed to memory cells during a program operation;
- generating converted data by reducing a number of data bit sets respectively corresponding to at least one program state among a plurality of program states, among the plurality of data bit sets; and
- programming the converted data to the memory cells.

17. The method of claim 16, wherein the at least one program state includes a program state having a highest threshold voltage distribution among the plurality of program states.

18. The method of claim 16, wherein the generating of the converted data comprises generating the converted data by inverting data values of set data of the data bit sets respectively corresponding to the at least one program state.

19. The method of claim 18, wherein the set data is least significant bit (LSB) data or most significant bit (MSB) data.

20. The method of claim 16, wherein the generating of the converted data comprises converting the data bit sets respectively corresponding to the at least one program state into data bit sets corresponding to program states having a lower threshold voltage distributions than the at least one program state.

21. The method of claim 16, wherein the generating of the converted data comprises comparing a total number of data values of set data of the data bit sets respectively corresponding to the at least one program state and determining whether to convert the data bit sets.

22. The method of claim 21, wherein the conversion operation is performed when a total number of first data values "1" is greater than a total number of second data values "0", among the set data of the data bit sets.

* * * * *